(12) United States Patent
Braithwaite (10) Patent No.: US 7,577,211 B2
(45) Date of Patent: Aug. 18, 2009

(54) DIGITAL PREDISTORTION SYSTEM AND METHOD FOR LINEARIZING AN RF POWER AMPLIFIER WITH NONLINEAR GAIN CHARACTERISTICS AND MEMORY EFFECTS

(75) Inventor: Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 533 days.

(21) Appl. No.: 11/063,447

(22) Filed: Feb. 23, 2005

(65) Prior Publication Data

US 2005/0190857 A1 Sep. 1, 2005

Related U.S. Application Data

(60) Provisional application No. 60/549,320, filed on Mar. 1, 2004.

(51) Int. Cl.
*H04K 1/02* (2006.01)
(52) U.S. Cl. ................. 375/296; 455/114.2; 455/114.3; 455/63.1; 455/126
(58) Field of Classification Search ................. 375/296; 455/22, 24, 42, 63.1, 114.2, 114.3, 126
See application file for complete search history.

(56) References Cited

U.S. PATENT DOCUMENTS

| 5,049,832 | A | 9/1991 | Cavers ........................ 330/149 |
| 5,867,065 | A | 2/1999 | Leyendecker ................ 330/149 |
| 5,923,712 | A | 7/1999 | Leyendecker ................ 375/297 |
| 5,959,500 | A | 9/1999 | Garrido ........................ 330/151 |
| 6,118,335 | A | 9/2000 | Nielsen et al. .................. 330/2 |
| 6,141,390 | A | 10/2000 | Cova ............................ 375/297 |
| 6,356,146 | B1 | 3/2002 | Wright et al. .................... 330/2 |
| 6,400,775 | B1 | 6/2002 | Gourgue et al. ............. 375/296 |
| 6,462,617 | B1 | 10/2002 | Kim ................................. 330/2 |
| 6,501,805 | B1 | 12/2002 | Twitchell ..................... 375/285 |
| 6,504,425 | B1 | 1/2003 | Kim ................................. 330/2 |
| 6,600,792 | B2 | 7/2003 | Antonio et al. .............. 375/297 |
| 6,642,786 | B1 | 11/2003 | Jin et al. ...................... 330/149 |
| 6,775,330 | B2 | 8/2004 | Bach et al. ................... 375/296 |
| 6,801,086 | B1 | 10/2004 | Chandrasekaran .......... 330/140 |
| 7,149,257 | B2 * | 12/2006 | Braithwaite .................. 375/296 |
| 2003/0179830 | A1 | 9/2003 | Eidson et al. ................ 375/296 |
| 2003/0197558 | A1 | 10/2003 | Bauder et al. ............... 330/149 |
| 2003/0223508 | A1 | 12/2003 | Ding et al. ................... 375/296 |
| 2004/0105510 | A1 | 6/2004 | Tomerlin et al. ............. 375/297 |
| 2004/0120420 | A1 | 6/2004 | Hongo et al. ................ 375/297 |
| 2004/0179629 | A1 | 9/2004 | Song et al. ................... 375/296 |

OTHER PUBLICATIONS

State Intellectual Property Office, P.R. China; First Office Action; Nov. 7, 2008.

* cited by examiner

*Primary Examiner*—Temica M Beamer
(74) *Attorney, Agent, or Firm*—Myers Andras Sherman LLP (57) ABSTRACT

A system and method of digitally predistorting a transmitter that has a digital input, up-converter, and a RF amplifier is disclosed. A digital predistorter preferably employs three paths for the digital input signal: a linear path, a memoryless digital predistortion path, and a memory based digital predistortion path. The memoryless path is preferably a look up table (LUT) of gain error corrections indexed to the input magnitude or input power. The linear path is separated to preserve the dynamic range of the system and avoid quantization associated with memoryless LUT correction. The memory based digital predistortion path filters the power envelope, or higher even order modes of the input signal magnitude, employing a hierarchical filter, to produce a gain correction. The input signal is modulated by the gain error corrections produced by the memoryless and memory based paths.

30 Claims, 8 Drawing Sheets

POWER ENVELOPE SPECTRUM

DIGITAL PREDISTORTION SYSTEM AND METHOD FOR LINEARIZING AN RF POWER AMPLIFIER WITH NONLINEAR GAIN CHARACTERISTICS AND MEMORY EFFECTS

RELATED APPLICATION INFORMATION

The present application claims priority under 35 USC 119 (e) to provisional application Ser. No. 60/549,320 filed Mar. 1, 2004, the disclosure of which is incorporated herein by reference its entirety.

FIELD OF THE INVENTION

The present invention relates to the field of wireless communications, specifically cellular base station transmission. More specifically, the present invention relates to linearizing a transmitter that converts a digital signal into a RF waveform, in particular linearizing the RF power amplifier.

BACKGROUND, PRIOR ART AND RELATED INFORMATION

In the RF transmission of digital information, sampled data sequences are converted to analog signals and processed, subsequently, by various operations containing unwanted nonlinearities. The primary source of nonlinearity is the power amplifier (PA). Nonlinear behavior of the PA (or other devices) can be compensated using digital predistortion (DPD). That is, the correction signal is a sampled sequence applied prior to the PA to create a corrected signal which compensates for nonlinear modes in the transmitter.

The nonlinear behavior of the PA transfer characteristics can be classified as memoryless or memory based. For a memoryless nonlinear device, the nonlinear modes are functions of the instantaneous input value, x(t), only. In contrast, for a PA exhibiting memory effects, the nonlinear modes are functions of both instantaneous and past input values. In general, memory effects exist in any PA; however, the effect becomes more apparent when the bandwidth of the input signal is large. As a result, the correction of memory effects will become increasingly more important as wide bandwidth modulation formats are put in use.

Therefore a need presently exists for an improved digital predistortion system where, in addition to correcting memoryless nonlinearities, the specific problem of compensating for memory effects associated with the power amplifier is addressed.

SUMMARY OF THE INVENTION

In a first aspect the present invention provides a digital predistorter adapted to receive a digital input signal and output a predistorted digital signal. The digital predistorter comprises an input coupled to receive the digital input signal. A first signal path is coupled to the input. A second signal path, coupled to the input in parallel with the first signal path, comprises a first digital predistorter circuit providing a first predistortion signal. The first digital predistorter circuit comprises a detector providing a signal related to the magnitude of the digital input signal and a Look Up Table of gain error corrections indexed by the signal related to the magnitude of the digital input signal. A third signal path, coupled to the input in parallel with the first and second signal paths, comprises a second digital predistorter circuit providing a polynomial based predistortion operation on the input signal and providing a second predistortion signal. A combiner circuit receives and combines the outputs of the first and second digital predistorter circuits with the output of the first signal path to provide a predistorted digital output signal.

In a preferred embodiment of the digital predistorter the Look Up Table preferably has a maximum index range which is less than the maximum magnitude of the digital input signal. The second digital predistorter circuit preferably comprises a fixed coefficient filter and an adaptive coefficient filter coupled in series. The fixed coefficient filter preferably comprises a Hanning filter. The second digital predistorter circuit further comprises a circuit providing a signal corresponding to a power of the magnitude of the input signal and the fixed coefficient filter provides a bandpass filtering operation on the signal corresponding to a power of the magnitude of the input signal. The second digital predistorter circuit preferably provides a third order predistortion signal from the input signal. The second digital predistorter circuit may further provide one or more 3+2m order predistortion signals from the input signal, where m is an integer. The adaptive coefficient filter of the second digital predistorter circuit preferably comprises at least three multipliers receiving and operating on the filter input with at least three adaptive filter coefficients. The adaptive coefficient filter of the second digital predistorter circuit preferably receives the output of the fixed coefficient filter as the filter input.

According to another aspect the present invention provides a digital predistortion circuit adapted to receive a digital input signal and output a digital predistortion compensation signal. The digital predistortion circuit comprises an input for receiving the digital input signal. A signal power detector circuit is coupled to the input and provides a digital power signal corresponding to a power of the magnitude of the input signal. A fixed coefficient filter bank is coupled to the signal power detector circuit and provides a bandpass filtering operation on the digital power signal. An adaptive coefficient filter bank is coupled in series with the fixed coefficient filter bank and operates on the output of the fixed coefficient filter bank, wherein the output of the adaptive filter bank is provided as a digital predistortion compensation signal.

In a preferred embodiment of the digital predistortion circuit the fixed coefficient filter bank comprises at least first, second and third bandpass filters operating on the digital power signal to provide first, second and third band limited power signals. The first, second and third band limited power signals may comprise sine, cosine and DC signals derived from the digital power signal. For example, the fixed coefficient filter bank may comprise a Hanning filter. The adaptive coefficient filter bank preferably comprises a source of at least three adaptive coefficients. The digital power signal may comprise a second order power of the input signal magnitude. The digital predistortion circuit preferably further comprises a multiplier coupled to receive the output of the adaptive coefficient filter bank and also to receive the input signal, wherein the multiplier outputs a third order signal as the digital predistortion compensation signal. The digital power signal may further comprise higher even order modes of the input signal magnitude and the digital predistortion circuit outputs higher odd order signals comprising the digital predistortion compensation signal.

According to another aspect the present invention provides an adaptively linearized transmission system comprising an input adapted to receive a digital input signal. A digital predistorter is coupled to the input and receives the digital input signal and outputs a predistorted digital signal. The digital predistorter comprises a hierarchical filter, including a fixed coefficient filter and an adaptive coefficient filter coupled in series, to compensate for memory effects of the transmission system. A digital to analog converter is coupled to receive the predistorted digital signal output of the digital predistorter and provides an analog signal. An up converter receives the analog signal from the digital to analog converter and converts it to an RF analog signal. A power amplifier receives the RF analog signal and provides an amplified RF output signal. An output sampling coupler is coupled to sample the analog RF output signal from the power amplifier. A feedback circuit path is coupled to the output sampling coupler and comprises a down converter and an analog to digital converter converting the sampled RF output signal to a digital sampled signal representative of the RF output signal. A forward gain mapping circuit is coupled to receive the input signal and provides a model of the effect of the digital predistorter and power amplifier on the input signal. An error generator circuit is coupled to receive the output of the forward gain mapping circuit and the digital sampled signal from the feedback circuit path and provides a digital error signal from the difference between the signals. An adaptive coefficient estimator circuit is coupled to receive the digital input signal and the digital error signal and provides updated predistortion coefficients to the adaptive filter in the digital predistorter.

In a preferred embodiment of the adaptively linearized transmission system the fixed coefficient filter comprises a band pass filter. For example, the fixed coefficient filter may comprise a Hanning filter. The coefficient estimator circuit preferably comprises a memory basis waveform generator circuit comprising a signal power detector providing a power signal corresponding to a power of the input signal magnitude and a hierarchical filter, comprising a band pass filter in series with a second filter, operating on the power signal and providing a plurality of basis waveforms. The coefficient estimator circuit preferably comprises a plurality of band pass filters receiving and operating on respective basis waveforms. The coefficient estimator circuit preferably further comprises an error coefficient estimator coupled to the output of the plurality of filters for computing errors in the adaptive filter coefficients. The coefficient estimator circuit preferably further comprises a coefficient update circuit for determining the updated filter coefficients from the errors in the adaptive filter coefficients. The forward gain mapping circuit and the coefficient estimator circuit may be implemented in a programmed digital signal processor.

According to another aspect the present invention provides a method for digitally predistorting a digital input signal to compensate for memory effect distortion in a transmission system including an RF power amplifier. The method comprises receiving a digital input signal, deriving a digital power signal corresponding to a power of the magnitude of the input signal, performing a first filtering operation on the digital power signal employing a fixed set of filter coefficients to provide a first filtered signal, performing a second filtering operation on the first filtered signal employing an adaptive set of filter coefficients to provide a second filtered signal, and providing a predistortion compensation signal from the second filtered signal.

In a preferred embodiment of the method for digitally predistorting a digital input signal, performing a first filtering operation comprises operating on the digital power signal employing a fixed Hanning kernel. The first filtered signal may comprise separate sine, cosine and DC components. Providing a predistortion compensation signal from the second filtered signal preferably comprises multiplying the second filtered signal with the input signal to provide a third order signal as the predistortion compensation signal. The method preferably further comprises sampling an output of the transmission system, modeling the transmission system gain operating on the input signal, determining an error from the sampled output and modeled output, and updating the adaptive filter coefficients using the error. Modeling the transmission system gain operating on the input signal preferably comprises modeling the filtering operation and the effect of distortion from the amplifier in the transmission system.

Further features and advantages of the present invention are set out in the following detailed description.

DETAILED DESCRIPTION OF THE INVENTION

Figure 1:
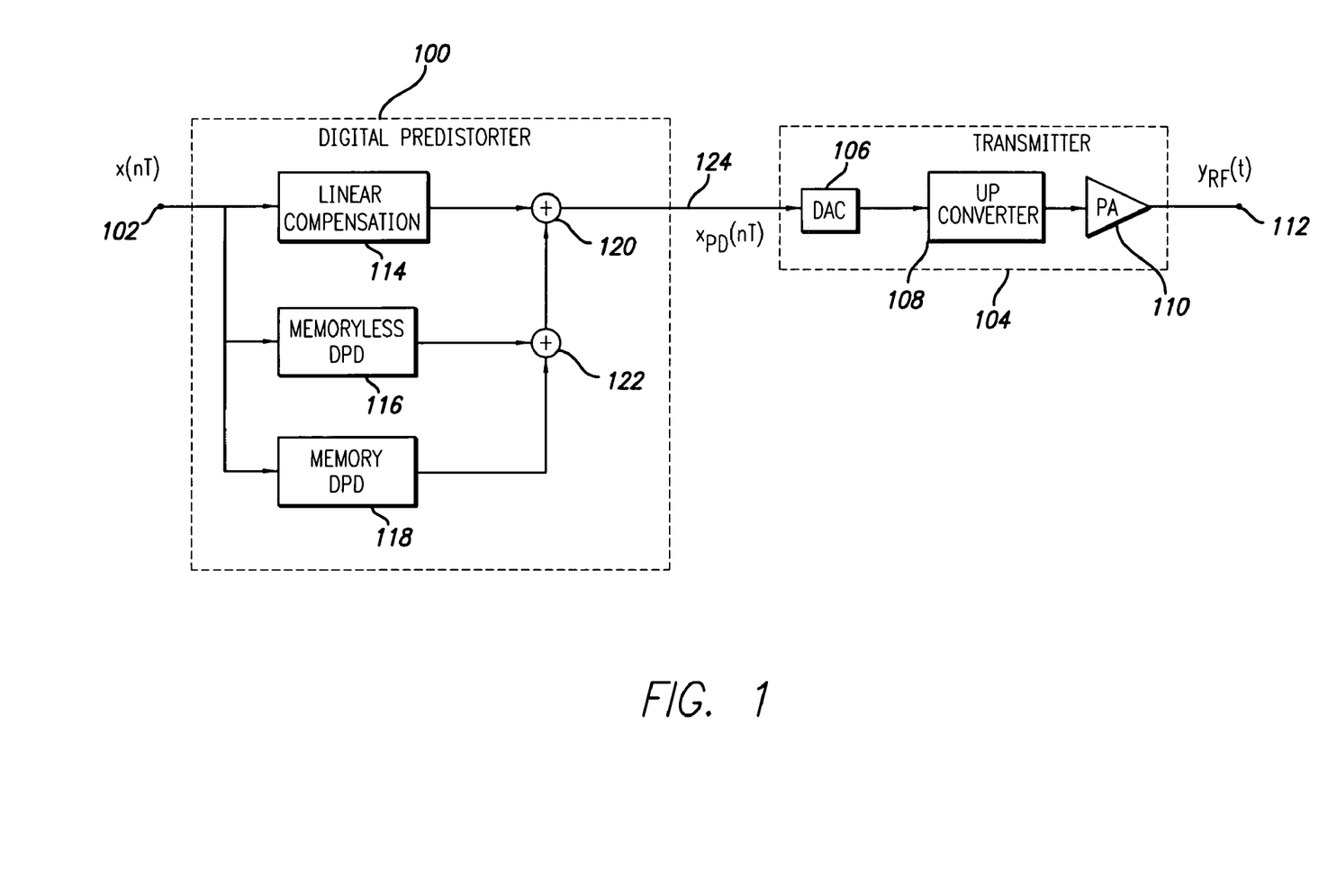
FIG. 1 is a block schematic drawing of a linearized transmission system employing a digital predistortion system and method in accordance with the present invention.

A linearized transmission system employing a digital predistortion system and method in accordance with a preferred embodiment of the invention is shown in FIG. 1.

Referring to FIG. 1, the linearized transmission system includes a digital predistorter (DPD) 100 for linearizing a transmitter 104 having a power amplifier (PA) 110 and conventional digital to analog converter (DAC) circuitry 106 and upconverter circuitry 108. A digital input signal x(nT) is applied at the input 102 and provided to digital predistorter 100. The digital input signal may typically be provided in complex form having an in phase (I) and quadrature (Q) component, as is well known in the art, and such is implied herein although single signal lines are shown for ease of illustration. For example, the input signal may be any of a number of known wide bandwidth signals, such as CDMA and WCDMA signals, employed in cellular wireless communications systems. The digital predistorter 100 receives the digital input signal x(nT) and predistorts it to a signal $x_{PD}(nT)$ to compensate for nonlinearities in the transmitter. The predistortion operation implemented by digital predistorter 100 corrects for nonlinearities of amplifier 110 and may also optionally correct any nonlinearities provided by the other components of the transmitter 104. The amplified analog signal is provided at output 112, typically to a conventional antenna system in a cellular wireless communications application (not shown).

As shown in FIG. 1, the digital predistorter 100 includes three parallel signal paths 114, 116 and 118. Path 114 provides linear compensation which may simply provide a delay to the input signal. The memoryless and memory digital predistortion (DPD) circuits 116, 118 are shown separately. As will be discussed later in detail, the memory DPD operation is based on a polynomial model of the nonlinearity and the memoryless DPD is (preferably) implemented using look-up tables that map the power amplifier gain corrections to the input signal magnitude (or power). Separating the memoryless and memory DPD circuits allows the use of different structures or different orders of nonlinear correction. The two predistortion corrections provided by memoryless DPD circuit block 116 and memory DPD circuit block 118 are combined at combining circuit 122, which may be a complex addition circuit, to form a combined predistortion correction to the input signal. This combined predistortion correction signal is then applied to the input signal at main path combining circuit 120, which may also be a complex addition circuit, to provide the predistorted digital signal. This predistorted digital signal is provided along line 124 to the digital input of transmitter circuitry 104.

More specifically, the predistorted signal, $x_{PD}(nT)$, is preferably the weighted sum of predefined basis waveforms derived from the input signal $x(nT)$. The basis waveforms can be described by one of three classes: linear waveforms that are linear functions of the input signal; nonlinear memoryless waveforms that are derived from the instantaneous sample of the input signal; and nonlinear memory-based waveforms that are nonlinear functions of input samples obtained over an interval of time. Associated with each basis waveform is a coefficient that acts as a complex weighting term. The coefficient weights allow adjustments in magnitude and phase of the basis waveforms before combining (adding together), and are used to minimize the distortion at the power amplifier output $y_{RF}(t)$. The selection of the basis functions and the estimation of the coefficients are described later.

As shown in FIG. 1, the correction signals (weighted basis waveforms) are added in parallel to compensate for subsequent nonlinear behaviour within the amplifier. The advantage of adding the correction signals is that the number of the basis waveforms can be increased as desired to improve the linearity of the entire system. That is, there is a trade-off between performance (amount of correction) and the complexity of the predistortion (number of basis waveforms generated).

In the preferred embodiment, the linear basis waveform is equal to the input signal, delayed if necessary to be time-aligned with the nonlinear basis waveforms. Any linear equalization or corrections for in-phase and quadrature errors within the up-conversion block may be compensated elsewhere in the transmission path. It is possible to include additional linear basis waveforms as part of the DPD; however, they have the potential to compete with any adaptive equalization blocks within the transmission path which would lead to coefficient drift (an undesirable effect).

As mentioned above, the nonlinear basis waveforms can be classified as memoryless or memory based. The memoryless basis waveform is characterized by a wide bandwidth and is derived from many nonlinear modes of the input signal. The memory based basis waveforms have narrower bandwidths and are preferably derived by filtering individual nonlinear modes of the input signal.

In the preferred embodiment, the correction of the memoryless component of the power amplifier nonlinearity is achieved using a look up table (LUT) of gain error terms that are indexed using the magnitude or squared magnitude of the input signal. The gain error terms are complex values allowing the adjustment of magnitude and phase as a function of the input magnitude. In an alternative embodiment, the memoryless correction may be achieved using a polynomial expansion whose basis waveforms are odd-order nonlinear modes of the input signal and whose coefficient weights are complex scalar terms.

In the preferred embodiment, the correction of the power amplifier memory effects involves creating even order nonlinear modes of the original signal, then applying narrow bandwidth filters to produce a set of even order sub-signals. One of the even order nonlinear modes would be the square magnitude of the input signal. The filtered even order sub-signals are memory based gain errors that modulate the input signal, thereby producing basis waveforms with the desired odd order correction. A coefficient weight is applied to each basis waveform to adjust the magnitude and phase. In the preferred method, the input signal provided on the linear path 114 is not transformed or sub-divided in any manner; only the nonlinear modes derived from the input signal are processed to generate the correction signal in paths 116 and 118 which are combined at combining circuit 122 with the input signal.

Figure 2:
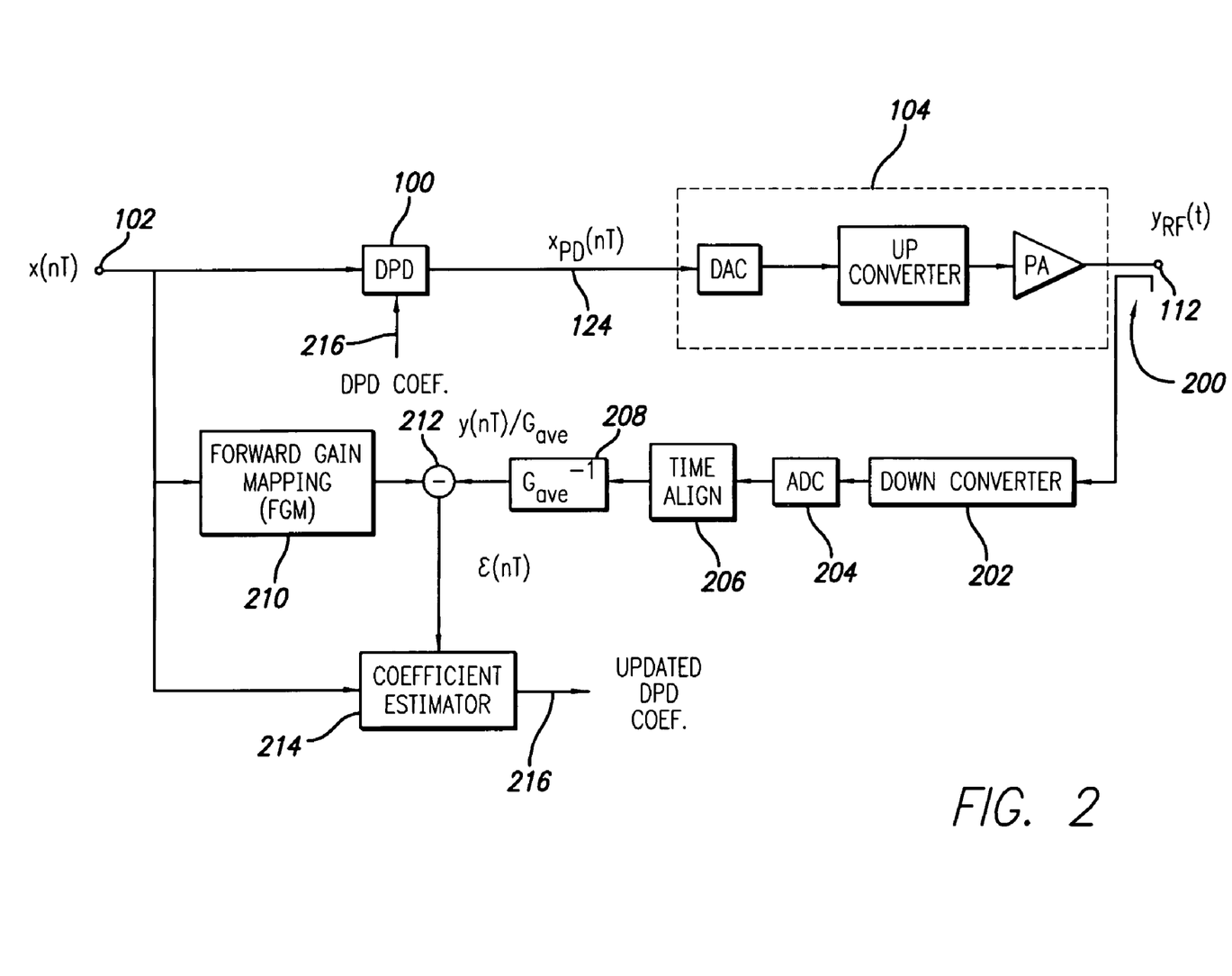
FIG. 2 is a block schematic drawing of a linearized transmission system employing an adaptive digital predistortion system in accordance with the present invention.

Referring to FIG. 2 an embodiment of the linearized transmission system of the present invention employing adaptive generation of digital predistotion coefficients is illustrated. The upper path in FIG. 2 corresponds to that of FIG. 1 and like numerals are employed. The adaptive embodiment of FIG. 2 adds a lower feedback path which employs the input and the sampled output to provide updated DPD parameters to DPD 100. This is achieved by estimating the coefficients that weight each basis waveform. In each iteration the forward gain including the linear signal and distortion is estimated from the input $x(nT)$ and output $y(nT)$.

Figure 4:
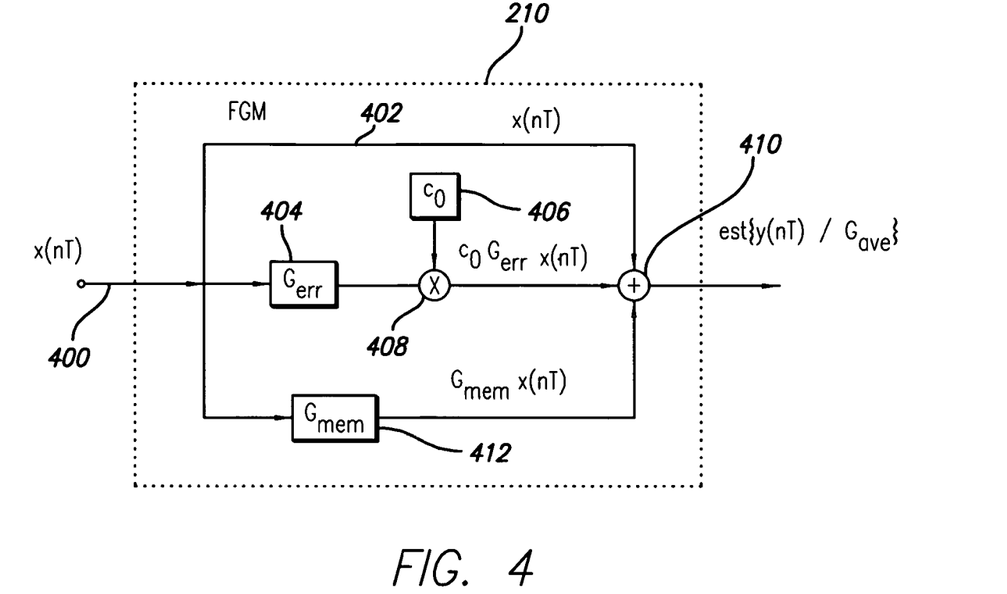
FIG. 4 is a block schematic drawing of the forward gain mapping circuit block of the system of FIG. 2.
Figure 7:
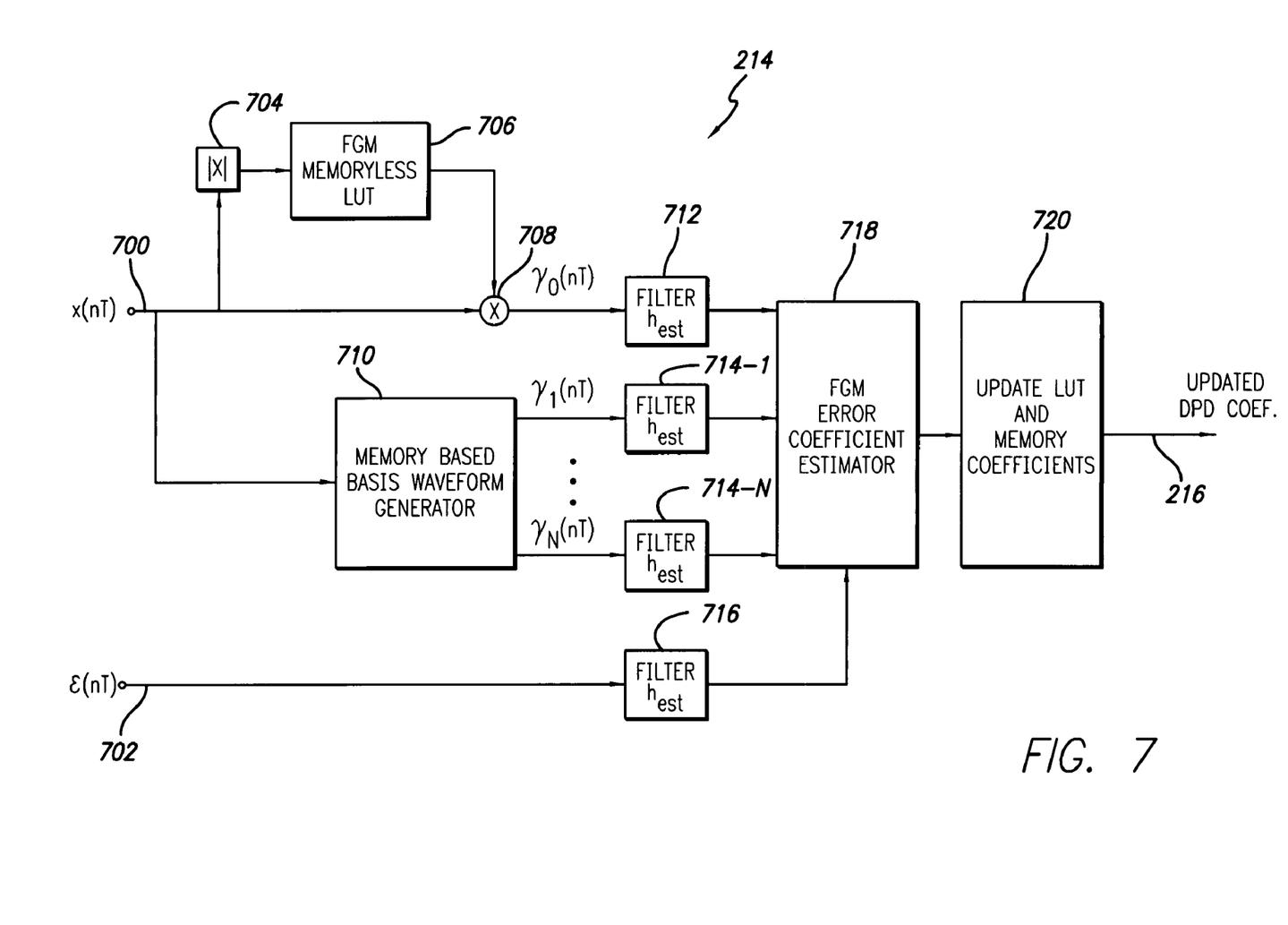
FIG. 7 is a schematic drawing showing a detailed implementation of the coefficient estimator block of FIG. 2 in accordance with a preferred embodiment of the invention.

More specifically, as shown in FIG. 2, the RF output of the amplifier 110 is sampled by a sampling coupler 200 and the sampled analog RF signal is down converted and demodulated to an analog I,Q signal by conventional analog down converter circuitry 202. The up and down conversion processing of the analog signals in the system are preferably phase synchronized by using the same local oscillator for both down conversion circuitry 202 and the up conversion circuitry in transmitter 104. The analog sampled output signal is converted to a digital signal by conventional analog to digital converter (ADC) circuitry 204. The output of analog to digital converter circuitry 204 is also aligned in time with the input at time alignment block 206 and is normalized to have the same nominal power and sample rate as the input at gain block 208. Time alignment does not have causal constraints because the input and output samples are captured first then processed as a batch (not real-time). The input signal is provided to forward gain mapping (FGM) circuit block 210 which may be implemented in a suitably programmed DSP implementing signal processing described in detail below (and a schematic drawing of the FGM block is shown in FIG. 4). The product of the input reference signal and the forward gain provides an estimate of the normalized output $y(nT)/G_{ave}$ (where $G_{ave}$ is the nominal gain defined later). The difference between the estimated and measured outputs, an error signal denoted by $\epsilon(nT)$, is output from circuit 212. A coefficient estimator processing block 214; which also may be implemented in the same or separate DSP as FGM block 210, is used to obtain the coefficient adjustments producing the least mean squared error. (A schematic drawing of the coefficient estimator processing block 214 is shown in FIG. 7.)

Figure 3:
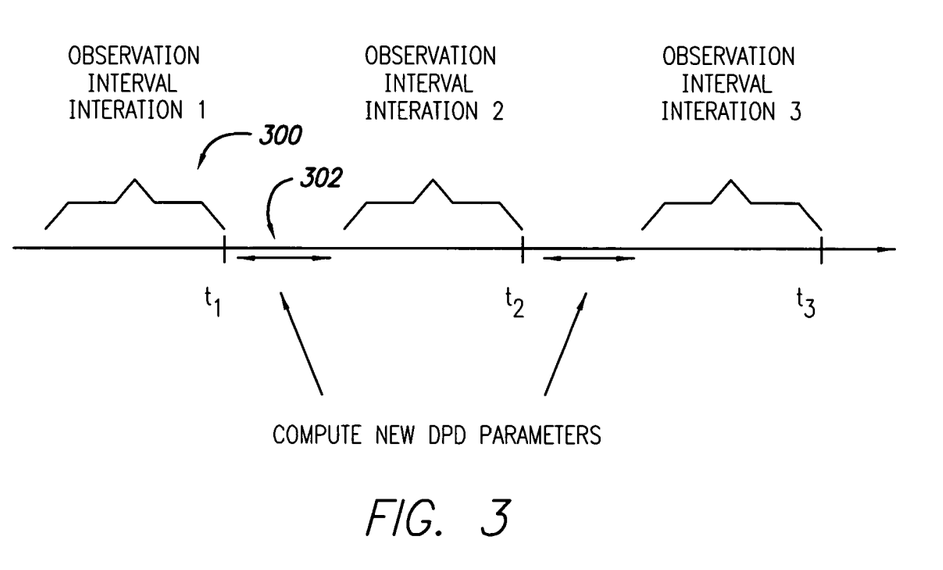
FIG. 3 is a timing diagram showing iteration timing in the adaptive digital predistortion linearized transmission system of FIG. 2.

The adaptive digital predistortion system and method of the embodiment of FIG. 2 preferably uses an iterative method to estimate and refine the correction signals provided by DPD 100 by providing updated DPD parameters. Each iteration comprises three steps: (1) capturing the input and output samples over an observation interval and estimating the forward gain error, (2) updating the accumulated forward gain error, and (3) computing the required DPD parameters. The timing of the iterations is shown in FIG. 3, which illustrates batch processing using observation or data capture intervals 300 and computation intervals 302 where updated DPD parameters are computed.

Referring again to FIG. 2, within the forward gain mapping circuit block 210 after input and output samples are obtained for the observation interval associated with iteration i, the forward gain is computed to minimize the residual error $\epsilon(t)$. The forward gain mapping for iteration i is denoted by FGM (i). The accumulated forward gain error is used to update the predistortion estimate, implemented by DPD 100 in FIG. 2.

In the preferred embodiment, the estimate of the desired DPD operation is the inverse of the accumulated forward gain error:

$$DPD = 1 + \left[ (FMG(1) - 1) + \sum_{i=2}^{N} \alpha \cdot (FMG(i) - 1) \right]^{-1} \quad \text{(Eq. 1)}$$

where $0 < \alpha < 1$ and $[\ ]^{-1}$ denotes an inverse operation, described later. As the system converges, the forward gain mapping FGM(i) approaches unity. Thus, two important aspects of (Eq. 1) are the accumulated gain error on the forward path and the inversion of the accumulated forward gain error to obtain the actual predistortion DPD operation.

The forward gain mapping for iteration i is $$FGM(i) = 1 + c_0 \cdot G_{err}(i) + G_{mem}(i) \quad \text{(Eq. 2)}$$

where $G_{err}$ is the memoryless gain error, $G_{mem}$ is the memory based gain error, and $c_0$ is a complex coefficient weight (near unity) that is affected by correlation between $G_{err}$ and $G_{mem}$ (described later in relation to the coefficient estimator 214). The functional blocks of FGM circuit 210 are shown in FIG. 4 and implement (Eq. 2). Specifically, the input signal at 400 is provided to three signal paths. The first signal path 402 simply provides the input signal to adder 410 (optionally with a suitable delay). The second signal path includes memoryless gain error function block 404, multiplier 408 and coefficient storage 406 implementing the second term of (Eq. 2) and providing the result to adder 410. The third signal path includes memory based gain error function block 412 which implements the third term of (Eq. 2) and provides the output to adder 410. The estimate of the output signal using the forward gain mapping is $$est\left\{\frac{y(nT)}{G_{ave}}\right\} = FGM(i) \cdot x(nT) \quad \text{(Eq. 3)}$$

where $G_{ave}$ is the average gain preferably computed as $$G_{ave} = \frac{\sum_{n} \{y(nT) \cdot x^*(nT)\}}{\sum_{n} \{x(nT) \cdot x^*(nT)\}}. \quad \text{(Eq. 4)}$$

The digital predistortion gain is obtained from the inverse of the accumulated FGM:

$$DPD = 1 + H_{err} + H_{mem} \quad \text{(Eq. 5)}$$

where $H_{err}$ is the inverse mapping of the accumulated $G_{err}$ (described later) and $H_{mem}$ is the inverse of the accumulated memory based gain error $G_{mem}$ (described later). The predistorted signal is $$x_{PD}(nT) = DPD \cdot x(nT). \quad \text{(Eq. 6)}$$

Figure 5:
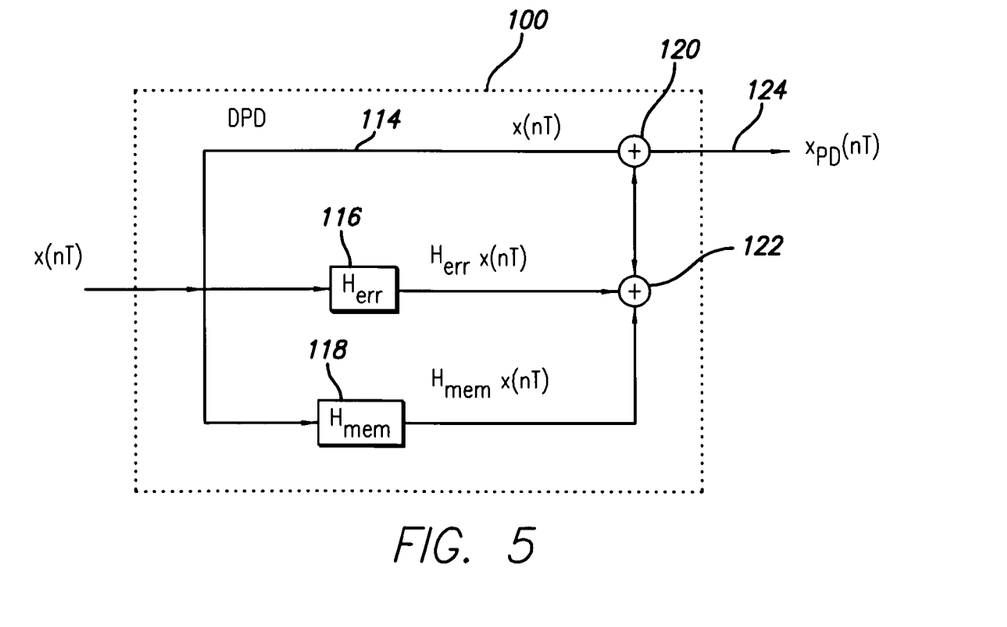
FIG. 5 is a functional block schematic drawing of the DPD block of FIGS. 1 and 2.

The functional blocks implementing (Eq. 5) in the DPD 100 are shown in FIG. 5. These functional blocks correspond to the DPD paths 114, 116 and 118 in FIG. 1 and like numerals are used in FIG. 5.

Next the details of the determination of $G_{err}$ and $H_{err}$ will be described in a preferred embodiment. In the preferred embodiment, the memoryless correction is implemented using a LUT that maps the input signal magnitude to the complex gain error. The range of input magnitudes is quantized into a fixed number of bins. For each input sample, the appropriate bin is identified, and the corresponding complex gain error is used to modulate the input sample. In general, the complex gain error varies with the input signal magnitude thus creating a nonlinear memoryless waveform.

The index for the LUT is $$L = round\{\rho \cdot [|x(nT)| - q]\} \quad \text{(Eq. 7)}$$

where $\rho$ is a scale term, q is an offset, and round{ } is an operator that identifies the nearest integer. The center magnitude of bin L is $$|x|_L = q + \frac{L}{\rho}. \quad \text{(Eq. 8)}$$

The number of bins required to model the memoryless gain error depends on the variations in the gain error over the input signal magnitude range. In general, the highest bin should have a center magnitude near the maximum input signal magnitude, $|x|_{max}$. In such cases, the number of bins would be $$L_{max} = round\{\rho \cdot [|x|_{max} - q]\} \quad \text{(Eq. 9)}$$

where $L_{max}$ is the number of bins. The selection of p determines $L_{max}$.

The complex gain error terms are the coefficients that must be estimated. Time-aligned input and output samples are grouped into bins based on the magnitude. Within each bin, the average gain error is computed. The gain error for bin L is $$G_{err}(L) = \frac{\sum_{\lambda} w_L \cdot \left\{ \left[ \frac{y(\lambda)}{G_{ave}} - x(\lambda) \right] \cdot x^*(\lambda) \right\}}{\sum_{\lambda} w_L \cdot \{x(\lambda) \cdot x^*(\lambda)\}} \quad \text{(Eq. 10)}$$

where $w_L$ is a window term that is a function of the input magnitude specified typically as $$w_L = \begin{cases} 1 & \text{for } -\frac{\rho}{2} \leq |x(\lambda)| - |x|_L < \frac{\rho}{2} \\ 0 & \text{elsewhere} \end{cases} \quad \text{(Eq. 11)}$$

The window term specified in (Eq. 11) makes the bins used in both the predistortion and the estimation equal. For the predistortion, a small $\rho$ is preferred because the bin separation is small which in turn reduces the quantization noise associated with the LUT. Unfortunately, the estimation accuracy in (Eq. 10) is reduced when $\rho$ (bin size) is small because fewer measurements are available for averaging. This can result in large fluctuations in neighboring bins. A trade-off between quantization noise in the predistorter and noise sensitivity in the estimator exists when using (Eq. 11) for both blocks.

In order to decouple the predistortion quantization and the estimation accuracy, the LUT is preferably smoothed. The preferred method is to select a weighting function $w_L$ for the estimation that overlaps the bin center spacing. One such weighting function is a Hanning window:

$$w_L = \quad \text{(Eq. 12)}$$
$$\begin{cases} 0.5 \cdot 1 + \cos[\sigma \cdot (|x(\lambda)| - |x|_L)] & \text{for } -\frac{\pi}{2} \leq \sigma \cdot (|x(\lambda)| - |x|_L) < \frac{\pi}{2} \\ 0 & \text{elsewhere} \end{cases}$$

where $\sigma$ controls the width of the Hanning window. Making $\sigma/\pi$ much larger than $\rho^{-1}$ results in a smooth LUT mapping.

The complex gain error for bin L, iteration number i, is denoted by $G_{err}(L,i)$. The accumulated forward gain error for bin L is $$acc\_G_{err}(L) = c_{0(i=1)} \cdot G_{err}(L, 1) + \alpha \cdot \sum_{i=2}^{N} c_{0(i)} \cdot G_{err}(L, i) \quad \text{(Eq. 13)}$$

where N is the number of iterations, $0 < \alpha < 1$, and $c_{0(i)}$ is a complex coefficient weight for iteration i. For large values of N, $G_{err}(L,N)$ approaches zero if the iterative process is converging.

Note the coefficient $c_{0(i)}$ is obtained as part of the estimation stage, described later, which includes both memoryless and memory based basis waveforms. The coefficient $c_{0(i)}$ is unity for a purely memoryless system; small deviations from unity occur due to correlation between the memoryless and memory based correction for the input signal format of interest.

There is a need to invert the accumulated forward gain error in order to predistort the signal. The inversion is preferably performed as follows:

$$H_{err}(L_{warped}) = \frac{-acc\_G_{err}(L)}{|1 + acc\_G_{err}(L)|} \quad \text{(Eq. 14)}$$

where $L_{warped}$ indicates that the center magnitude of bin L has changed. The initial stage of the inversion warps the center magnitudes of the bins, compressing it when the gain is low ($G_{err}<0$) and expanding it when the gain is high ($G_{err}>0$): that is, the new center magnitude, denoted by $|x|_{L,warped}$, becomes $$|x|_{L,warped} = |x|_L \cdot |1 + acc\_G_{err}(L)|. \quad \text{(Eq. 15)}$$

It is convenient to use interpolation to resample the LUT bins so that the center magnitudes are the same as the original bin indices L.

Computing the gain error instead of the gain has the advantage of not quantizing the linear portion of the input signal which tends to be significantly larger than the required correction signal.

Next the details of the memory based correction and the determination of $G_{mem}$ and $H_{mem}$ will be described in a preferred embodiment. The memory based correction is preferably achieved using filtered nonlinear modes to model the memory based gain errors. Filtering is applied to even order nonlinear modes of the input; the resultant signal is modulated by the input signal to obtain the basis waveforms:

$$\gamma_k(nT) = \beta_k(nT) \cdot x(nT) \quad \text{(Eq. 16)}$$

where $\gamma_k$ is the basis waveform and $\beta_k$ is the filtered even order nonlinear mode also referred to as a "memory based gain error function".

Each memory based gain error function is defined by the order of the nonlinear mode and the center frequency of the bandpass filtering:

$$\beta_{m,p}(nT) = \left[\sum_{\tau} |x(nT)|^m \cdot g_m(\tau - nT) \cdot \exp(j \cdot \omega_p \cdot (\tau - nT))\right] \quad \text{(Eq. 17)}$$

where $\omega_p$ is the center frequency of the filter, m is the mode order, and $g_m(t)$ is the baseband kernel of the filter. The selections of the baseband kernel and the center frequencies are described below.

The selection of the frequencies $\omega_p$ and the baseband kernel affect the accuracy of the distortion cancellation. In the preferred embodiment, the spacing of the frequencies is fixed for a given mode, but may be different between modes. Similarly, the baseband kernel used within each mode is identical, but, in general, it is different between values of m.

For example, consider a second order memory based gain error function:

$$\beta_{2,p}(nT) = \left[\sum_{\tau} |x(nT)|^2 \cdot g_2(\tau - nT) \cdot \exp(j \cdot \omega_p \cdot (\tau - nT))\right]. \quad \text{(Eq. 18)}$$

There is a separate function, $\beta_{2,p}$, for each frequency $\omega_p$. The fourth order gain error function would be $$\beta_{4,p}(nT) = \left[\sum_{\tau} |x(nT)|^4 \cdot g_4(\tau - nT) \cdot \exp(j \cdot \omega_p \cdot (\tau - nT))\right]. \quad \text{(Eq. 19)}$$

In general, the baseband kernels, $g_2$ and $g_4$, are different with the latter being narrower in terms of the standard deviation within the time domain. In addition, the set of the gain error functions is larger for $g_4$ compared to $g_2$ because more frequencies need to be specified. This is due to the fact that the intermodulation covers a wider portion of the spectrum as the order of the nonlinearity increases. As a result, more computations are required to compensate for higher order nonlinear modes using (Eq. 17).

Alternative memory based gain error functions can be defined that model higher order nonlinearities using lower order gain functions. For example, assume that a set of second order gain error functions has been computed, as shown in (Eq. 18). Higher order gain error functions can be obtained as follows:

$$alt\_\beta_{m,p}(nT) = |x(nT)|^{m-2} \cdot \beta_{2,p}(nT). \quad \text{(Eq. 20)}$$

This re-use of lower-order results provides significant improvements in computational efficiency.

One advantage of the present memory based correction is that the number of gain error functions used can be adjusted as required with the goal of meeting spectral mask specifications (plus margin). The selection of the frequencies, $\omega_p$, and the baseband kernels, $g_m$, determines the distortion cancellation performance for a given power amplifier and input signal. It is desirable to select the minimum number of memory based gain error functions required to meet the spectral mask.

There is a trade-off that occurs in selecting the number and characteristics of the gain error functions. For example, over-specifying the number of gain error functions provides greater accuracy in the forward modeling of the distortion; however, problems emerge during the estimation of the weighting coefficients. The estimation becomes more difficult because the solution is ill-conditioned or, in the extreme case, not unique.

Consider the non-uniqueness case. A homogenous solution exists because the basis waveforms are not independent. There exists a vector of non-zero coefficients that produces a zero waveform. This homogeneous coefficient vector can be altered by a scale factor without affecting the fit of forward gain model, which means that additional steps must be taken to avoid coefficient drift. In particular, it is desirable to minimize the contribution of the homogenous coefficient vector to the coefficient vector used in the forward gain model. Failing to control the homogeneous mode of the coefficient vector can result in the coefficients increasing to their maximum values, at which point the forward gain model will become invalid.

Ill-conditioning is a less severe effect than the above-mentioned problem, and is due to mild over-specification of the number of gain error functions. When the solution is ill-conditioned, the estimator will use the excess degrees of freedom to fit the forward gain model to random noise (instead of deterministic intermodulation distortion only). Over a long interval, random noise is not correlated to the nonlinear modes of the input signal. However, over shorter observation intervals, some correlation may exist and will be included (incorrectly) in the coefficient vector of the forward gain model. After the forward gain is inverted the subsequent predistortion will generate a noise-like spectrum that degrades the power amplifier performance.

To avoid problems associated with ill-conditioning and non-uniqueness, it is important to exploit knowledge of the input signal and its spectral characteristics to select the best gain error functions (baseband kernels and frequencies) for the memory based correction. For the single carrier case, the best baseband kernel is related to the pulse shape and the temporal spacing of the digital symbols used to generate $x(nT)$ and the order of the nonlinear mode. This can produce unusual looking kernels such as Baastians' function. For simplicity, the preferred implementation selects a simpler kernel, such as a Hanning function, and adjusts the width of the kernel to obtain a bandwidth suitable for $x(nT)$ and the order of the nonlinear mode of interest.

For the case of a multi-carrier input waveform, the input $x(nT)$ is the sum of two or more bandlimited carriers that are offset in frequency relative to each other. The bandwidth of the individual carriers is typically less than the frequency offset, which makes the linear signals disjoint in frequency. However, the nonlinear modes of the composite signal include intermodulation between carriers resulting in distortion appearing outside the original bandwidth of the input signal. The bandwidths and center frequencies of intermodulation terms can be computed from the bandwidths and center frequencies of the carriers. The frequency spacing and baseband kernel bandwidths of the filters used to generate the memory basis waveforms are selected to match the intermodulation between carriers.

In general, the multi-carrier case is of greater interest than the single carrier case when selecting the best memory based gain error functions. A multi-carrier input waveform has a wider bandwidth, and the degradation associated with the memory effects of the power amplifier is most noticeable at wider bandwidths.

Figure 6:
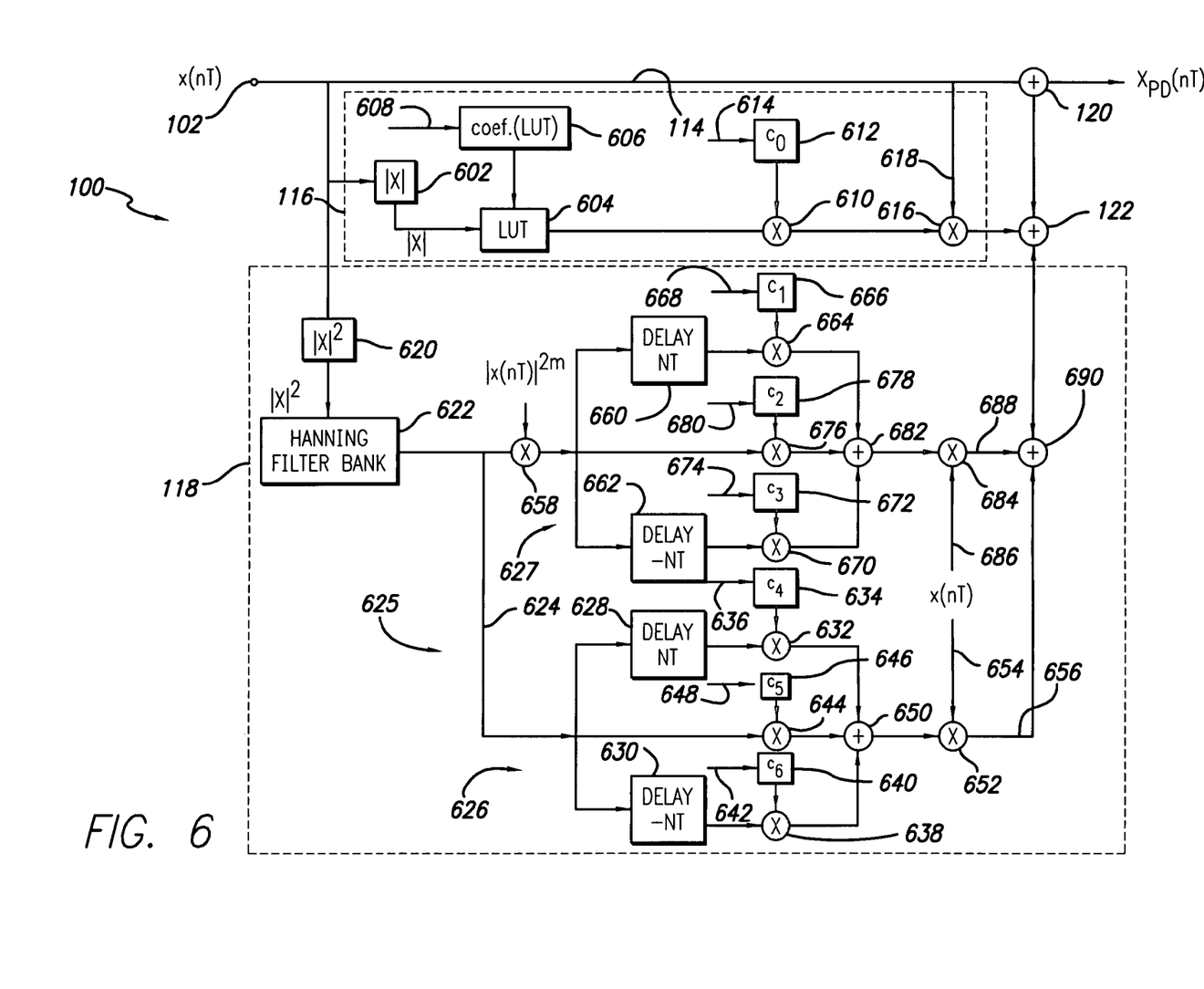
FIG. 6 is a schematic drawing showing a detailed implementation of the DPD block of FIGS. 1 and 2 in accordance with a preferred embodiment of the invention.

In the DPD approach of the present invention, the baseband kernel is made adaptive by specifying a simple kernel, such as a Hanning window, followed by a multi-tap FIR filter (as shown in FIG. 6 discussed below). The FIR filter comprises multiple versions of the Hanning filtered nonlinear mode, each delayed by a different amount and weighted by coefficients. Adjusting the coefficient weights and summing the delayed waveforms achieves the desired filtering. Treating each delayed mode as a separate basis waveform, the coefficients are estimated directly using the method described later. However, from the point of view of the forward gain model, the series combination of the Hanning window and FIR filter creates an adaptive hierarchical window where the adaptation of the FIR coefficients alters, slightly, the center frequency, mean delay, and the bandwidth of the window. This provides enough flexibility to model the deterministic distortion accurately while constraining the degrees-of-freedom sufficiently to minimize the effects of random noise. The number of coefficients within the FIR filter is preferably small (for example, three coefficients are shown in FIG. 6) and the delay spacing is preferably half of the Hanning window size (N samples shown in FIG. 6). However, the delay spacing and the number coefficients can be altered if additional precision in the forward model is required.

The forward gain error model for the memory-based correction at iteration i is $$G_{mem}(i) = \sum_k c_k(i) \cdot \beta_k(nT) \qquad \text{(Eq. 21)}$$

where $c_k(i)$ are complex coefficients at iteration i. Note that the index n,p has been replaced by k for notational convenience. The estimation of the complex coefficients is described later. The accumulated forward gain error coefficient is $$\text{acc\_c}_k = c_k(1) + \sum_{i=2}^{N} \alpha \cdot c_k(i) \qquad \text{(Eq. 22)}$$

where $0<\alpha<1$. As the process converges, $c_k(i)$ approaches zero. The memory-based predistortion is approximated as the negative of the accumulated forward coefficients:

$$H_{mem} = \sum_k -\text{acc\_c}_k \cdot \beta_k(nT). \qquad \text{(Eq. 23)}$$

Next referring to FIG. 6, a detailed embodiment of the DPD circuit 100 is illustrated. As shown, the input provided at 102 is provided along a first linear signal path 114 which may be a simple connection to combiner 120 or may include a delay if necessary depending on the particular implementation of the circuitry in the parallel DPD paths. The input signal is also provided to the memoryless compensation path 116 as described above in relation to FIG. 1. In the memoryless path 116 the input is provided to a signal magnitude detector circuit 602 which obtains a signal corresponding to the magnitude of the input signal and provides it to a look up table (LUT) 604 which employs it to index the LUT entries which provide the memoryless gain error mapping described above. Alternatively, the signal used to index the LUT may be any other suitable signal related to the magnitude of the input signal, for example, a power signal or any function that increases monotonically with the input signal magnitude. The coefficients stored in the lookup table 604 will be periodically updated by circuit 606 which receives updated coefficients along line 608 from the coefficient estimator block 214 in the adaptive embodiment as described above in relation to FIG. 2. The output of the LUT 604 is provided to a multiplier 610 which receives a complex coefficient (described above in relation to Eq. 13) from nonvolatile storage 612 to provide a weighted output. The coefficient stored in memory 612 may be periodically updated along line 614 in an adaptive embodiment as described above in relation to FIG. 2. The output of multiplier 610 is provided to a second multiplier 616 which also receives the input signal along line 618 to provide the higher order memoryless basis function component of the digital predistortion compensation signal to summing circuit 122.

The input signal from input 102 is also provided to the memory based correction DPD path 118. The input signal is provided to a signal power detector 620 which derives a signal corresponding to a power of the magnitude of the input signal. In particular, as illustrated the circuit 620 may provide a power signal corresponding to the square of the magnitude of the input signal which power signal output is then operated on by a hierarchical filter and the filter output, or memory based gain error function, is modulated by the input signal. More particularly, the hierarchical filter includes a first fixed coefficient filter 622 providing a band pass filtering operation using a fixed filter kernel followed by a multi-tap FIR filter 625 employing adaptive filter coefficients. The fixed coefficient filter 622 may comprise in a preferred embodiment a Hanning filter bank. One specific embodiment of the Hanning filter bank is described below in relation to FIG. 8. In such an embodiment, the output of the filter bank comprises three real signals: a sine, cosine and DC signal. Accordingly, with this embodiment of the Hanning filter employed in FIG. 6 the output of the filter 622 will comprise three real signals although a single line is shown for ease of illustration. Alternatively, the output of the filter 622 may be a single complex signal or a single real signal. As shown, the output of the filter bank 622 is provided to the adaptive coefficient filter 625. A first branch 626 of the filter 625 receives the output of the filter bank 622 along line 624 and implements an adaptive coefficient filtering operation to provide a third order memory compensation signal output along line 656. Specifically, the signal on line 624 is provided through a first delay 628 to multiplier 632 which also receives a complex filter coefficient provided from nonvolatile storage location 634. In the adaptive embodiment described above in relation to FIG. 2 the complex coefficient in the storage location 634 is updated periodically along line 636 from the coefficient estimator block. Similarly, the input signal along line 624 is provided to multiplier 644 which receives a complex filter coefficient from nonvolatile storage location 646 which complex coefficient is updated periodically along line 648. Also, the signal along line 624 is provided via delay 630 to multiplier 638 which receives a complex filter coefficient from nonvolatile storage location 640, which complex filter coefficient is updated periodically along line 642. The outputs of the three multipliers 632, 644 and 638 are provided to addition circuit 650 which then provides the output of the filter 626 to a multiplier 652 which receives the input signal along line 654. The filtered output modulated by the input signal is provided along line 656 as a third order memory compensation signal.

Optionally, the filter 625 may further comprise additional higher order memory compensation branches 627. Each such branch preferably comprises an adaptive FIR filter which receives higher order powers of the magnitude of the input signal which are filtered and modulated with the input signal to provide higher order memory compensation signals, e.g., 5th order, 7th order, etc. These higher order signal branches of filter 625 are illustrated collectively by the circuit block 627. Specifically, multiplier 658 receives an even power of the signal magnitude and the output of the filter 622 and provides the higher order output signal to a multi-tap FIR filter. This FIR filter comprises multiplier 664 receiving the delayed signal from delay 660 and a complex coefficient from storage location 666; multiplier 676 which receives complex coefficients from storage location 678; multiplier 670 which receives the delayed input signal from delay 662 and receives complex filter coefficients from storage location 672; and addition circuit 682 which receives the output of the three multipliers 664, 676 and 670. The output of this higher order filter branch is provided to a multiplier 684 which receives the input signal along line 686 to provide a 3+2m order memory compensation signal along line 688. This higher order FIR filter is adaptive and coefficient storage locations 666, 672 and 678 receive updated coefficients along lines 668, 674 and 680 respectively. The third and higher order memory compensation signals are combined at addition circuit 690 to provide a combined memory compensation signal. This combined memory compensation signal is provided to combiner 122. The output of combiner 122 is the combined memoryless and memory predistortion compensation signal which is provided to combiner 120 and combined with the input signal to provide the predistorted input signal as an output.

Next the principles of operation of the coefficient estimator block 214 will be described followed by a discussion of a specific implementation in relation to FIG. 7. The coefficients are preferably computed using a weighted least mean square (LMS) estimation. A sampled error signal is computed as shown in FIG. 2:

$$\varepsilon(nT) = \frac{y(nT)}{G_{ave}} - FGM \cdot x(nT) \qquad \text{(Eq. 24)}$$

where the output signal y(nT) has been down-converted, sampled, and time-aligned to match the input signal x(nT) in a nominal sense as described above in relation to FIG. 2. The estimation error can be rewritten as $$\varepsilon(nT) = \varepsilon_0(nT) - c_0 \cdot \gamma_0(nT) - \sum_k c_k \cdot \gamma_k(nT) \qquad \text{(Eq. 25)}$$

where $$\varepsilon_0(nT) = \frac{y(nT)}{G_{ave}} - x(nT), \qquad \text{(Eq. 26)}$$

the memoryless basis waveform, $\gamma_0(nT)$, is $$\gamma_0(nT) = G_{err} \cdot x(nT), \qquad \text{(Eq. 27)}$$

and the memory basis waveforms, $\gamma_k(nT)$, are either $$\gamma_k(nT)=\beta_k(nT)\cdot x(nT) \quad \text{(Eq. 28)}$$

or $$\gamma_k(nT)=alt\_\beta_k(nT)\cdot x(nT) \quad \text{(Eq. 29)}$$

depending on which form of the gain error function is used. The LMS estimation of the memory based coefficients $c_k$ minimizes $|\epsilon(nT)|^2$.

Consider, for example, the case where three basis waveforms are used to compensate for memory based nonlinearities, plus the memoryless basis waveform, $\gamma_0$. A direct LMS estimation is described below. Measurements are accumulated over a time interval $[nT-n_oT,nT]$. The estimated coefficients are $$\begin{bmatrix} c_0 \\ c_1 \\ c_2 \\ c_3 \end{bmatrix} = [\gamma_v \cdot \gamma_v^T]^{-1} \cdot \gamma_v \cdot \varepsilon_{0,v} \quad \text{(Eq. 30)}$$

where $\epsilon_{0,v}=[\epsilon_0(nT-n_oT) \ldots \epsilon_0(nT)]^T$ and $$\gamma_v = \begin{bmatrix} \gamma_0(nT-n_oT) & \ldots & \gamma_0(nT) \\ \gamma_1(nT-n_oT) & \ldots & \gamma_1(nT) \\ \gamma_2(nT-n_oT) & \ldots & \gamma_2(nT) \\ \gamma_3(nT-n_oT) & \ldots & \gamma_3(nT) \end{bmatrix}. \quad \text{(Eq. 31)}$$

One problem with the direct implementation of the LMS estimator is that the compensation favors portions of the spectrum with large error power. Unfortunately, this corresponds, typically, to the bandwidth spanning the linear signal. In general, the strictest limits on the spectral emission specified by government regulators are outside of the bandwidth occupied by the linear signal. It is beneficial to bias the estimation to favor portions of the spectrum that have the tightest emission limits.

To bias the estimation, the error signal and the basis waveforms are modified using a linear operation, such as a filter. Since the coefficients are constants, a linear operator, denoted by $f_{linear}(\ )$, can be applied to each basis waveform separately (exploiting superposition, see FIG. 7): that is, $$f_{linear}\{\varepsilon(nT)\} = f_{linear}\{\varepsilon_0(nT)\} - \sum_{k=0}^{k\max} c_k \cdot f_{linear}\{\gamma_k(nT)\}. \quad \text{(Eq. 32)}$$

An example of a linear operation is an FIR filter whose kernel, $h_{est}(mT)$, preferably highlights the critical portions of the spectrum, as specified by the relevant standards:

$$f_{linear}\{\varepsilon(nT)\} = \sum_m \varepsilon(mT) \cdot h_{est}(nT-mT). \quad \text{(Eq. 33)}$$

Other linear operations, such IIR filters, can also be used in (Eq. 32). Thus, to improve the distortion cancellation in a specific portion of the spectrum, the following are substituted into (Eq. 30):

$$\varepsilon_{0,v} = [f_{linear}\{\varepsilon_0(nT-n_oT)\} \quad \cdots \quad f_{linear}\{\varepsilon_0(nT)\}]^T \quad \text{(Eq. 34)}$$

and $$\gamma_v = \begin{bmatrix} f_{linear}\{\gamma_0(nT-n_oT)\} & \cdots & f_{linear}\{\gamma_0(nT)\} \\ f_{linear}\{\gamma_1(nT-n_oT)\} & \cdots & f_{linear}\{\gamma_1(nT)\} \\ f_{linear}\{\gamma_2(nT-n_oT)\} & \cdots & f_{linear}\{\gamma_2(nT)\} \\ f_{linear}\{\gamma_3(nT-n_oT)\} & \cdots & f_{linear}\{\gamma_3(nT)\} \end{bmatrix} \quad \text{(Eq. 35)}$$

When using filtering to block the linear portion of the spectrum, there is the risk that some or all of the filtered basis waveforms are zero (or very close to zero). It is recommended that the estimation be regularized to stabilize the estimation: that is, $$\begin{bmatrix} c_0 \\ c_1 \\ c_2 \\ c_3 \end{bmatrix} = [\gamma_v \cdot \gamma_v^T + R]^{-1} \cdot [\gamma_v \cdot \varepsilon_{0,v} + R \cdot c_{v,default}] \quad \text{(Eq. 36)}$$

where R is a regularization matrix and $c_{v,default}$ is a default coefficient vector. The typical structure of R and $c_{v,default}$ are $$R = \begin{bmatrix} r_{00} & 0 & 0 & 0 \\ 0 & r_{11} & 0 & 0 \\ 0 & 0 & r_{22} & 0 \\ 0 & 0 & 0 & r_{33} \end{bmatrix} \quad \text{(Eq. 37)}$$

and $$c_{v,default} = [1 \quad 0 \quad 0 \quad 0]^T. \quad \text{(Eq. 38)}$$

In general, the elements of the matrix R are usually small compared to the corresponding elements in the matrix $\gamma_v\gamma_v^T$. However, in some cases, it is desirable to specify a large value of $r_{00}$ to force the coefficient weighting of the memoryless basis waveform to be unity.

There exists the possibility of interaction between the coefficients of the memoryless LUT and the memory based coefficients during the estimation process, especially for band-limited input signals. This is due in part to the fact that auto-correlation of input signal appears similar to delay spreading associated with memory effects. The interaction, if present in a deleterious form, is characterized by ripples in the upper bins of the LUT and increasingly large absolute values of the memory coefficients over time. In the following, details of the implementation that reduce the interaction between memoryless and memory based coefficient estimation are discussed.

In the previous section, the coefficient $c_0$ is used in the memory coefficient estimation, instead of setting it to unity. This reduces the interaction by discounting the memoryless correction by $c_0$.

Another detail of the implementation that reduces the interaction is the specification of an input range for the LUT that is less than the maximum input magnitude. Sampled measurements of input/output pairs whose input magnitude exceeds the upper bin are ignored in the LUT coefficient estimation. Ignoring large peaks prevents abrupt changes in the LUT gain error at the upper bin that could become problematic during the gain error inversion.

The inversion of the forward gain error LUT is constrained as well. In most cases, the warping associated with the inversion compresses the center magnitudes of the bins. This leaves the inversion gain errors at the upper bins undefined. In this implementation, a threshold magnitude is specified that is larger than the maximum input magnitude. At this threshold magnitude, the accumulated forward gain error is set to zero. During the interpolation stage used to restore the original bin magnitudes, the inverted gain errors above the warped upper bin are filled in with values decaying linearly towards zero. The decay rate is determined by the difference between the warped magnitude of the uppermost bin and the chosen threshold magnitude. As a result, the correction provided by the LUT decreases for large inputs exceeding the LUT index range, allowing the correction to be dominated by the memory based correction. This tends to prevent interactions between the LUT and memory based coefficients.

The accumulated gain error LUT is smoothed, preferably, each iteration, before the inversion, to help reduce the interactions between the LUT and the memory based coefficients. Errors introduced by the smoothing are reduced over time by the iterative process. The steady state solution is largely unaffected by modest smoothing, but the transient behavior of the coefficients is better behaved.

Figure 10:
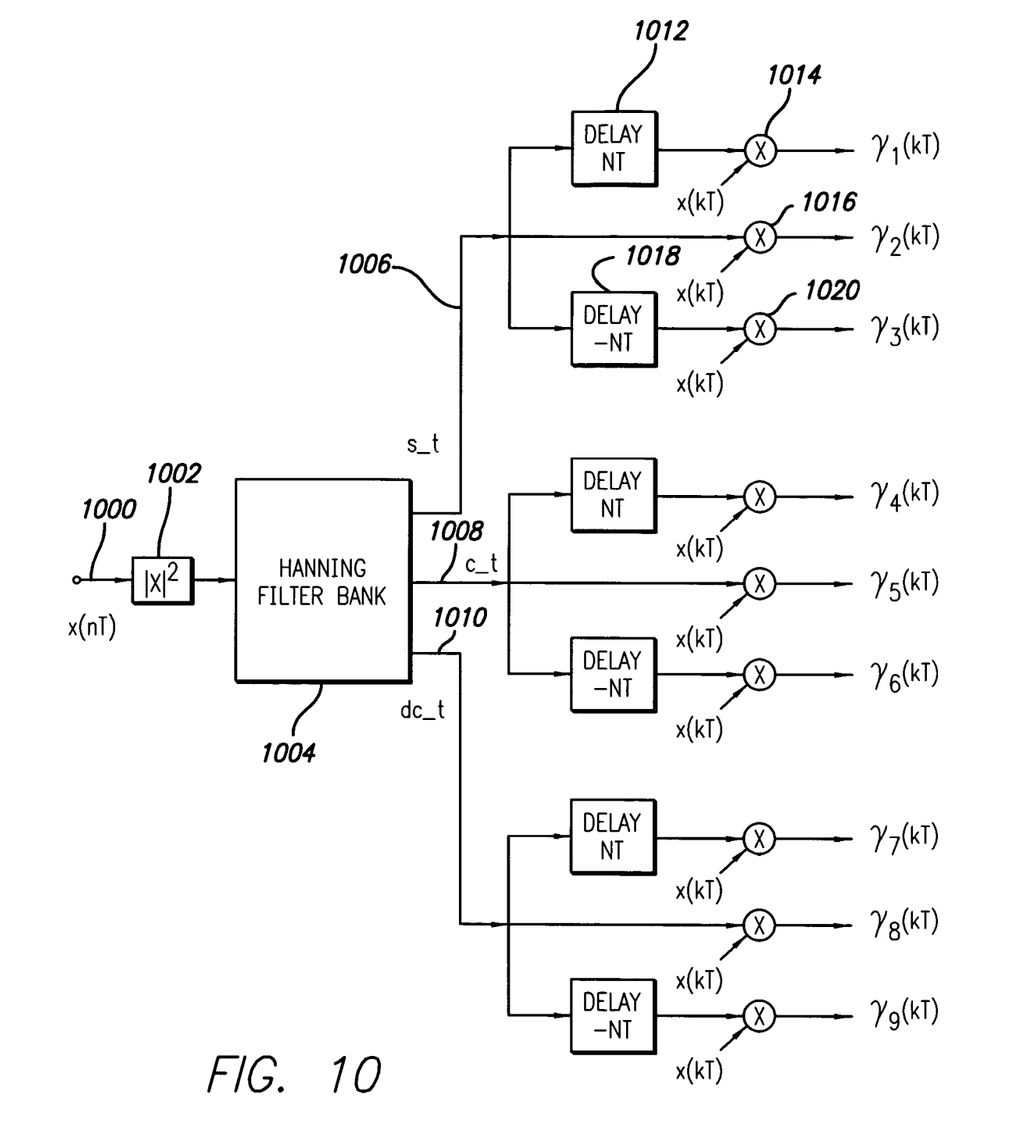
FIG. 10 is a schematic drawing showing a detailed implementation of the basis waveform generator block of FIG. 7 in accordance with a preferred embodiment of the invention.

Referring to FIG. 7 a specific implementation of the coefficient estimator block 214 is illustrated in a block schematic diagram. As shown, the coefficient estimator block receives as inputs the input signal along line 700 and the error signal along line 702, as described above in relation to FIG. 2 and also (Eq. 24). The input signal provided along line 700 is provided to a magnitude detector 704 which derives a signal corresponding to the magnitude of the input signal and the signal magnitude is used to index a memoryless look up table forward gain mapping circuit 706. The output of the look up table 706 is then mixed with the input signal at multiplier 708 to provide a memoryless basis function as an output. This memoryless basis waveform is provided to filter 712 which may preferably comprise an FIR filter as described above in relation to (Eq. 33). As noted above other suitable linear operators may be employed including an IIR filter. The input signal along line 700 is also provided to memory based basis waveform generator 710 which provides the memory based basis waveforms, N of which are illustrated in FIG. 7. A specific embodiment of circuit 710 is illustrated in FIG. 10 described below. The output memory basis waveforms from waveform generator 710 are provided to respective filter blocks 714-1 to 714-N which also may preferably comprise FIR filters as described above in relation to (Eq. 33) or other suitable linear operators including IIR filters. Filter 716 similarly provides an FIR or other suitable linear operation on the error signal provided at input 702. The outputs of the filters are provided to forward gain mapping error coefficient estimator block 718 which determines errors in the coefficients using the above described least mean square processing. Coefficient error value are then provided to an update block 720 which uses the coefficient errors to provide updated corrected coefficients which are then provided to the DPD 100 along line 216 as described previously.

Figure 8:
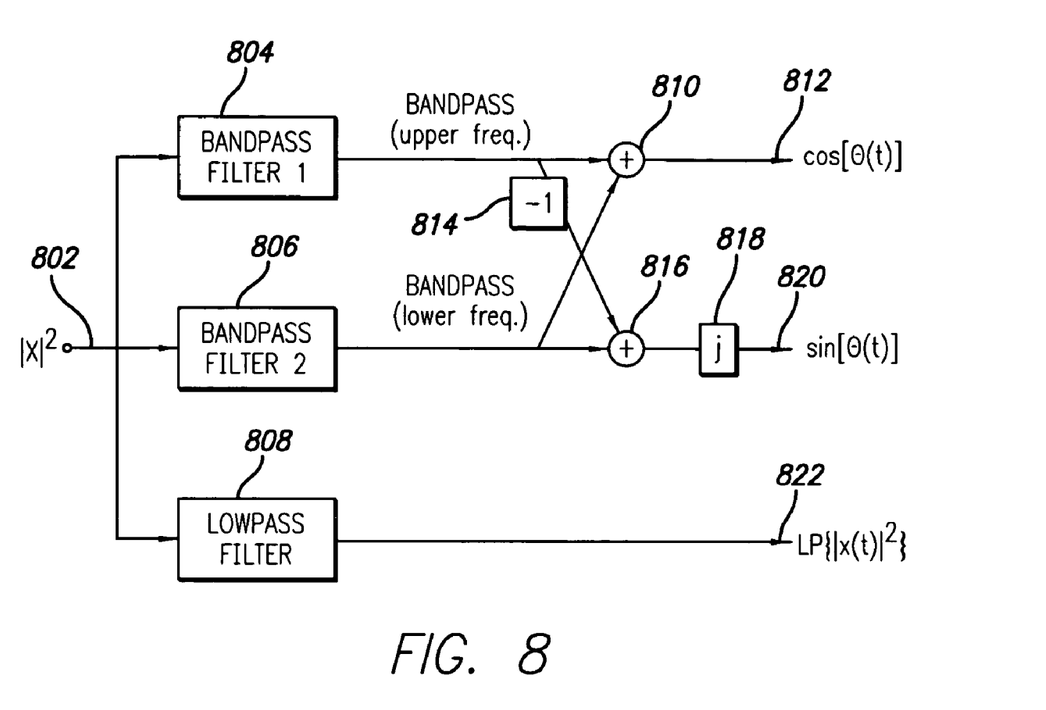
FIG. 8 is a schematic drawing showing a detailed implementation of the Hanning filter block of FIG. 6 in accordance with a preferred embodiment of the invention.
Figure 9:
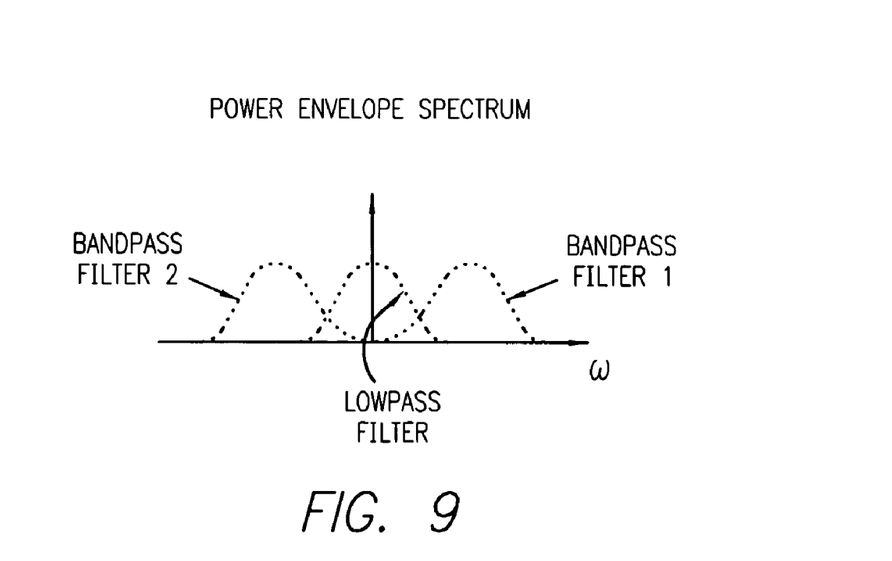
FIG. 9 is a graphical representation of the filtered output of the Hanning filter block of FIG. 8.

Next referring to FIG. 8, a preferred embodiment of the Hanning filter bank 622 is illustrated in a block schematic drawing. As shown, the filter bank receives the input power signal at an input 802 which is split to three signal paths which provide three separate filtering operations. More specifically, a first band pass filter 804 and a second band pass filter 806 provide a high and low band pass filtering operation on the power signal. The outputs of the first and second band pass filters are used to generate cosine and sine signals output along lines 812 and 820, respectively, by employing cross connected summing circuit 810 and 816, inverter 814 and 90 degree phase rotation circuit 818. Low pass filter 808 in turn passes the DC component of the power signal and provides it as an output on line 822. The general resulting form of the power envelope spectrum provided by the above implementation of the Hanning filter is shown in FIG. 8 which shows the three separate generally Gaussian output signals derived from the input power signal. It should be appreciated that additional band pass filtering may be employed to provide additional Gaussian output signals derived from the input power signal.

Next referring to FIG. 10, a preferred embodiment of the memory based basis waveform generator 710 shown in FIG. 7 is illustrated in a detailed schematic drawing. As shown, the circuit receives the input signal along line 1000 which is provided to a signal power detector 1002 which provides a power signal output to Hanning filter bank 1004. The implementation of FIG. 10 may preferably employ a Hanning filter bank such as described above in relation to FIG. 8 and the output of the filter bank 1004 comprises three real signals, and in particular sine, cosine and DC signals provided along lines 1006, 1008 and 1010 as illustrated. The outputs of the Hanning filter bank 1004 are provided to three separate FIR filters which provide a filtering operation on the input signals and provide as an output the respective basis waveforms as illustrated. Since the operation of each filter is the same only a first filter will be described. As illustrated the filter comprises a first filter branch with a delay 1012 which provides its output to multiplier 1014 which also receives the input signal and provides a first memory basis waveform output, a second filter branch provides the signal on line 1006 to multiplier 1016 which also receives the input signal and provides a second memory basis waveform output, and a third branch of the filter includes delay 1018 which provides its output to multiplier 1020 which also receives the input signal and provides as an output the third memory basis waveform as illustrated. Although nine memory basis functions are shown in FIG. 10, additional basis functions or fewer, may be employed.

In an alternative embodiment, the adaptive coefficient estimator function described above may employ predistortion coefficient lists and an associated list management program, implemented in a suitably programmed DSP, along with the functionality of coefficient estimator block 214. The best coefficients for digital predistortion change with the average input magnitude (or power), temperature, input format (number and frequency of active carriers), and other measurable input or environmental quantities. In the above described approach, the changes in the optimum coefficients are tracked by the adaptive nature of the system. However, it is possible to correlate past successful coefficients with the input and environmental quantities by forming a list of past successful coefficient vectors where each is assigned an attribute vector. The attribute vector acts as a multi-dimensional index that includes input magnitude, input format, temperature, and other measurable input or environmental quantities. When changes in the input or environment quantities are large enough to degrade the predistortion performance, a new coefficient vector is retrieved from the list that has the closest attribute vector to the current measured attributes. The iterative process uses this new coefficient vector as an initial starting point. This list method is described in U.S. patent application Ser. No. 10/761,788 filed Jan. 21, 2004 for the case of feedforward compensation, and in U.S. patent application Ser. No. 10/889,636 for adaptive predistortion linearization, the disclosures of which applications are incorporated herein by reference in their entirety. In particular the functions described in U.S. patent application Ser. No. 10/889,636, including forming and maintaining the list of predistortion coefficients, may be directly employed.

When forming the predistortion coefficient list, one must choose whether to store all coefficients including the memoryless LUT entries or just the memory-based coefficients (including the coefficient $c_0$). The memoryless LUT entries tend to vary less when the regularization within (Eq. 36) is applied aggressively; in such cases only the memory based coefficients need to be stored.

When using the predistortion coefficient list, it is necessary to specify distance measures for judging the similarity of two attribute vectors and the similarity of two coefficient vectors. The attribute distance measure is described in the above noted U.S. patent application Ser. No. 10/889,636 (and in U.S. patent application Ser. No. 10/761,788). The coefficient distance measure is used in one of two pruning processes that identify and delete redundant elements (attribute and coefficient vector pairs). The coefficient distance measure can include both the memory LUT and the memory coefficients; however, for simplicity, it is recommended that the distance be based on the memory coefficient differences only.

It is also necessary to create a measure to determine the quality of the digital predistortion correction and to specify a threshold to determine when the correction is successful. The correction quality is ideally related to the relevant spectral mask specified by government agencies. A successful correction passes the mask requirements with sufficient margin. It is easier, however, to specify the correction quality as a function of the residual squared error ($E\{|\epsilon_0|^2\}$ where $E\{\ \}$ indicates expected value) or the residual squared filtered error ($E\{|f_{linear}\{\epsilon_0\}|^2\}$), which are computed during the estimation process. These residuals would be normalized typically by the input signal power (or other input measure). The forward gain error coefficients for a given iteration (not the accumulated forward gain error) can also be used to judge the quality of correction because they approach zero as the iterative process converges to its optimal value. $L_2$ or $L_{inf}$ norms can be applied to the forward gain error coefficients and compared to a chosen threshold to determine if the correction is successful.

The present invention thus provides a digital predistortion system and method having a number of features and advantages, including the following: the use of gain error correction to minimize the effects of LUT quantization; the combination of memoryless LUT correction with a polynomial based memory based correction; the use of hierarchical filtering to improve the memory based correction by creating an adaptive filter structure capable of compensating for deterministic distortion without introducing rogue degrees-of-freedom that incorrectly attempt to model random signal processes, (which in turn would increase the noise floor and is undesirable); the implementation of higher order memory compensation by re-using lower order memory results enhancing the computational efficiency of the implementation; the estimation of the coefficients using a least mean square method that is weighted to give greater correction in different parts of the spectrum (using spectral weighting that, in general, reflects the spectral mask limits specified by government agencies); and undesired interactions between the LUT and the reactive memory modules are avoided using LUT smoothing and gain error limiting in the LUT inversion.

Although a specific embodiment and implementation details have been described these are not meant to be limiting in nature as a number of variations and modifications can be provided, as will be appreciated by one skilled in the art.

What is claimed is:

1. A digital predistorter adapted to receive a digital input signal and output a predistorted digital signal, the digital predistorter comprising:
   an input coupled to receive the digital input signal;
   a first signal path coupled to the input;
   a second signal path, coupled to the input in parallel with said first signal path, comprising a first digital predistorter circuit providing a first predistortion signal, wherein said first digital predistorter circuit comprises a detector providing a signal related to the magnitude of the digital input signal and a Look Up Table of gain error corrections indexed by said signal related to the magnitude of the digital input signal;
   a third signal path, coupled to the input in parallel with said first and second signal path, comprising a second digital predistorter circuit providing a polynomial based predistortion operation on the input signal and providing a second predistortion signal; and
   a combiner circuit which receives and combines the outputs of the first and second digital predistorter circuits with the output of the first signal path to provide a predistorted digital output signal.

2. A digital predistorter as set out in claim 1, wherein said second digital predistorter circuit comprises a fixed coefficient filter and an adaptive coefficient filter coupled in series.

3. A digital predistorter as set out in claim 1, wherein said Look Up Table has a maximum index range which is less than the maximum magnitude of the digital input signal.

4. A digital predistorter as set out in claim 2, wherein said fixed coefficient filter of said second digital predistorter circuit comprises a Hanning filter.

5. A digital predistorter as set out in claim 2, wherein said second digital predistorter circuit further comprises a circuit providing a signal corresponding to a power of the magnitude of the input signal and wherein said fixed coefficient filter provides a bandpass filtering operation on said signal corresponding to a power of the magnitude of the input signal.

6. A digital predistorter as set out in claim 5, wherein said second digital predistorter circuit provides a third order predistortion signal from said input signal.

7. A digital predistorter as set out in claim 6, wherein said second digital predistorter circuit further provides one or more 3+2m order predistortion signals from said input signal, where m is an integer.

8. A digital predistorter as set out in claim 2, wherein said adaptive coefficient filter of said second digital predistorter circuit comprises at least three multipliers receiving and operating oh the filter input with at least three adaptive filter coefficients.

9. A digital predistorter as set out in claim 2, wherein said adaptive coefficient filter of said second digital predistorter circuit receives the output of the fixed coefficient filter as the filter input.

10. A digital predistortion circuit adapted to receive a digital input signal and output a digital predistortion compensation signal, the digital predistortion circuit comprising:
    an input for receiving the digital input signal;
    a signal power detector circuit coupled to the input and providing a digital power signal corresponding to a power of the magnitude of the input signal;
    a fixed coefficient filter bank, coupled to the signal power detector circuit and providing a bandpass filtering operation on said digital power signal; and
    an adaptive coefficient filter bank coupled in series with said fixed coefficient filter bank and operating on the output of said fixed coefficient filter bank, wherein the output of the adaptive filter bank is provided as a digital predistortion compensation signal.

11. A digital predistortion circuit as set out in claim 10, wherein said fixed coefficient filter bank comprises at least first, second and third bandpass filters operating on said digital power signal to provide first, second and third band limited power signals.

12. A digital predistortion circuit as set out in claim 11, wherein said first, second and third band limited power signals comprise sine, cosine and DC signals derived from said digital power signal.

13. A digital predistortion circuit as set out in claim 10, wherein said fixed coefficient filter bank comprises a Hanning filter.

14. A digital predistortion circuit as set out in claim 10, wherein said adaptive coefficient filter bank comprises a source of at least three adaptive coefficients.

15. A digital predistortion circuit as set out in claim 10, wherein said digital power signal comprises a second order power of the input signal magnitude and wherein said digital predistortion circuit further comprises a multiplier coupled to receive the output of the adaptive coefficient filter bank and also to receive the input signal, wherein said multiplier outputs a third order signal as said digital predistortion compensation signal.

16. A digital predistortion circuit as set out in claim 15, wherein said digital power signal further comprises higher even order modes of the input signal magnitude and wherein said digital predistortion circuit outputs higher odd order signals comprising said digital predistortion compensation signal.

17. An adaptively linearized transmission system, comprising:
an input adapted to receive a digital input signal;
a digital predistorter coupled to the input and receiving the digital input signal and outputting a predistorted digital signal, the digital predistorter comprising a hierarchical filter, including a fixed coefficient filter and an adaptive coefficient filter coupled in series, to compensate for memory effects of the transmission system;
a digital to analog converter coupled to receive the predistorted digital signal output of the digital predistorter and provide an analog signal;
an up converter for receiving the analog signal from the digital to analog converter and converting it to an RF analog signal;
a power amplifier receiving the RF analog signal and providing an amplified RF output signal;
an output sampling coupler coupled to sample the analog RF output signal from the power amplifier;
a feedback circuit path, coupled to the output sampling coupler, comprising a down converter and an analog to digital converter converting the sampled RF output signal to a digital sampled signal representative of the RF output signal;
a forward gain mapping circuit coupled to receive the input signal and providing a model of the effect of the digital predistorter and power amplifier on the input signal;
an error generator circuit coupled to receive the output of the forward gain mapping circuit and the digital sampled signal from the feedback circuit path and providing a digital error signal from the difference between the signals; and
an adaptive coefficient estimator circuit, coupled to receive the digital input signal and the digital error signal and providing updated filter coefficients to the adaptive filter in said digital predistorter.

18. An adaptively linearized transmission system as set out in claim 17, wherein said fixed coefficient filter comprises a band pass filter.

19. An adaptively linearized transmission system as set out in claim 17, wherein said fixed coefficient filter comprises a Hanning filter.

20. An adaptively linearized transmission system as set out in claim 18, wherein said coefficient estimator circuit comprises a memory basis waveform generator circuit comprising a signal power detector providing a power signal corresponding to a power of the input signal magnitude and a hierarchical filter, comprising a band pass filter in series with a second filter, operating on the power signal and providing a plurality of basis waveforms.

21. An adaptively linearized transmission system as set out in claim 20, wherein said coefficient estimator circuit further comprises a plurality of band pass filters receiving and operating on respective basis waveforms.

22. An adaptively linearized transmission system as set out in claim 21, wherein said coefficient estimator circuit further comprises an error coefficient estimator coupled to the output of said plurality of filters for computing errors in the adaptive filter coefficients.

23. An adaptively linearized transmission system as set out in claim 22, wherein said coefficient estimator circuit further comprises a coefficient update circuit for determining said updated filter coefficients from said errors in said adaptive filter coefficients.

24. An adaptively linearized transmission system as set out in claim 20, wherein said forward gain mapping circuit and said coefficient estimator circuit are implemented in a programmed digital signal processor.

25. A method for digitally predistorting a digital input signal to compensate for memory effect distortion in a transmission system including an RF power amplifier, comprising:
receiving a digital input signal;
deriving a digital power signal corresponding to a power of the magnitude of the input signal;
performing a first filtering operation on said digital power signal employing a fixed set of filter coefficients to provide a first filtered signal;
performing a second filtering operation on said first filtered signal employing an adaptive set of filter coefficients to provide a second filtered signal; and
providing a predistortion compensation signal from said second filtered signal.

26. A method for digitally predistorting a digital input signal as set out in claim 25, wherein performing a first filtering operation comprises operating on said digital power signal employing a fixed Hanning kernel.

27. A method for digitally predistorting a digital input signal as set out in claim 25, wherein said first filtered signal comprises separate sine, cosine and DC components.

28. A method for digitally predistorting a digital input signal as set out in claim 25, wherein providing a predistortion compensation signal from said second filtered signal comprises multiplying said second filtered signal with said input signal to provide a third order signal as said predistortion compensation signal.

29. A method for digitally predistorting a digital input signal as set out in claim 25, further comprising sampling an output of said transmission system, modeling the transmission system gain operating on said input signal, determining an error from the sampled output and modeled output, and updating said adaptive filter coefficients using said error.

30. A method for digitally predistorting a digital input signal as set out in claim 29, wherein modeling the transmission system gain operating on said input signal comprises modeling the filtering operation and the effect of distortion from the amplifier in the transmission system.

* * * * *